US008421341B2

(12) United States Patent
Kim et al.

(10) Patent No.: US 8,421,341 B2
(45) Date of Patent: Apr. 16, 2013

(54) ORGANIC ELECTROLUMINESCENT DEVICE

(75) Inventors: Chang-Oh Kim, Gwangmyeong-si (KR); Hwa-Kyung Kim, Gimpo-si (KR); Sung-Hoon Pieh, Seoul (KR)

(73) Assignee: LG Display Co., Ltd., Seoul (KR)

( * ) Notice: Subject to any disclaimer, the term of this patent is extended or adjusted under 35 U.S.C. 154(b) by 103 days.

(21) Appl. No.: 12/851,395

(22) Filed: Aug. 5, 2010

(65) Prior Publication Data

US 2011/0073885 A1    Mar. 31, 2011

(30) Foreign Application Priority Data

Sep. 25, 2009 (KR) ........................ 10-2009-0091363

(51) Int. Cl.
*H01J 1/62* (2006.01)
*H01J 63/04* (2006.01)
(52) U.S. Cl.
USPC ............ 313/504; 313/500; 313/503; 313/506
(58) Field of Classification Search .......... 313/498–512, 313/112, 113
See application file for complete search history.

(56) References Cited

U.S. PATENT DOCUMENTS

| | | | |
|---|---|---|---|
| 2005/0040756 A1* | 2/2005 | Winters et al. | 313/504 |
| 2006/0214573 A1* | 9/2006 | Maeda et al. | 313/506 |
| 2006/0240277 A1* | 10/2006 | Hatwar et al. | 428/690 |
| 2006/0289882 A1* | 12/2006 | Nishimura et al. | 257/94 |
| 2007/0052345 A1* | 3/2007 | Wano | 313/504 |
| 2007/0222374 A1* | 9/2007 | Egawa et al. | 313/504 |
| 2010/0026180 A1* | 2/2010 | Kobayashi | 313/506 |

FOREIGN PATENT DOCUMENTS

JP    2006-269327    10/2006

OTHER PUBLICATIONS

"Reason Behind the New Structure Used in Sony's Organic EL Panel" Part 5-2 through 5-5; Flat Panel Display 2005, pp. 128-152.
"Low-cost Flat Xe Lamp to Compete with Large Led Backlights" Part 6-1 through 6-4; Flat Panel Display 2005, pp. 154-176.
"Projectors Getting Brighter and Smaller, With Better Color Reproducibility" Part 7-1 through 7-3; Flat Panel Display 2005; pp. 178-194.

* cited by examiner

*Primary Examiner* — Anh Mai
*Assistant Examiner* — Kevin Quarterman
(74) *Attorney, Agent, or Firm* — McKenna Long & Aldridge, LLP

(57) ABSTRACT

An electroluminescent device includes: first to third pixel regions; a first electrode in each of the first to third pixel regions, wherein the first electrode of the third pixel region has a first thickness, the first electrode of the first pixel region has a second thickness less than the first thickness, and the first electrode of the second pixel region has a third thickness less than the second thickness; a second electrode in each of the first to third pixel regions; at least two electroluminescent units in each of the first and third pixel regions and disposed between the first electrode and second electrode, wherein one of the at least two electroluminescent units includes a blue light emitting layer and the other of the at least two electroluminescent units include a red/green light emitting layer; and a charge generation layer disposed between the at least two electroluminescent units.

8 Claims, 6 Drawing Sheets

ORGANIC ELECTROLUMINESCENT DEVICE

The present invention claims the benefit of Korean Patent Application No. 10-2009-0091363, filed in Korea on Sep. 25, 2009, which is hereby incorporated by reference for all purposes as if fully set forth herein.

BACKGROUND OF THE INVENTION

1. Field of the Invention

The present invention relates to an organic electroluminescent device.

2. Discussion of the Related Art

Until recently, display devices have typically used cathode-ray tubes (CRTs). Presently, many efforts and studies are being made to develop various types of flat panel displays, such as liquid crystal displays (LCDs), plasma display panels (PDPs), field emission displays, and electro-luminescence displays (ELDs), as a substitute for CRTs. Of these flat panel displays, organic electroluminescent displays (OELDs) are self-luminescent display devices. The OELD operate at low voltages and have a thin profile. Further, the OELD have fast response time, high brightness, and wide viewing angles.

The OELD is generally categorized into a passive matrix type OELD and an active matrix type OELD.

FIG. 1 is a schematic circuit diagram illustrating an active matrix type OELD according to the related art.

Referring to FIG. 1, the OELD includes a gate line GL and a data line DL crossing each other to define a pixel region P. A power line PL is formed in parallel with the data line DL.

In the pixel region P, a switching thin film transistor STr, a driving thin film transistor DTr, a storage capacitor StgC and an organic light emitting diode E are formed. An organic light emitting diode E includes a first electrode, a second electrode and an organic light emitting layer between the first and second electrodes. The first electrode is formed in each pixel region P and connected to the driving thin film transistor DTr. The second electrode is formed over all pixel regions and functions as a common electrode.

When an ON gate voltage is applied to the gate line GL, the switching thin film transistor STr is turned on, and a data voltage is applied to the data line DL. The data voltage passes through the switching thin film transistor STr and is applied to the gate electrode of the driving thin film transistor DTr. A current passing through the driving thin film transistor DTr is adjusted according to the data voltage applied to the driving thin film transistor DTr, and the current is applied to the organic light emitting diode E. The storage capacitor StgC stores the data voltage applied to the driving thin film transistor DTr while the switching thin film transistor STr is turned off.

FIG. 2 is a schematic cross-sectional view illustrating an OELD according to the related art.

Referring to FIG. 2, the OELD 1 includes first and second substrates 3 and 31 facing each other. The first and second substrates 3 and 31 are coupled to each other through a seal pattern 40 between peripheral portions of the first and second substrates 3 and 31.

On the first substrate 3, a driving thin film transistor DTr, and a first electrode 12 connected to the driving thin film transistor DTr are formed in each pixel region. An organic light emitting layer 14 is formed on the first electrode 12. The organic light emitting layer 14 includes red (R), green (G) and blue (B) organic light emitting patterns 14a, 14b and 14c in the respective pixel regions. A second electrode 16 is formed on the organic light emitting layer 14. The first and second electrodes 12 and 16 function to apply an electric field to the organic light emitting layer 14. The first and second electrodes 12 and 16 and the organic light emitting layer 14 form an organic light emitting diode in the pixel region.

The second substrate 31 functions as an encapsulation substrate and is spaced apart from the second electrode 16.

As described above, the organic light emitting layers emitting red, green and blue lights are formed in the respective pixel regions. The organic light emitting layers are different in lifetime according to their material properties. Particularly, the blue organic light emitting layer has the shortest lifetime. Accordingly, when the lifetime of the blue organic light emitting layer ends, the lifetime of the OELD also ends. In other words, the lifetime of the OELD depends on the lifetime of the blue organic light emitting material.

Further, the organic light emitting layer emits light having a specific wavelength according to its material property, and intensity and color of the emitted light are determined by passing through several layers. This is a mechanism for light emission from the light emitting diode. Since several mediums forming the several layers on the light path have respective predetermined refractive indexes, light reflectance and transmittance are determined. By using this, light chromaticity and intensity may be optimized. However, the related art OELD does not have the optimized configuration, light efficiency is relatively reduced.

SUMMARY OF THE INVENTION

Accordingly, the present invention is directed to an organic electroluminescent device that substantially obviates one or more of the problems due to limitations and disadvantages of the related art.

An advantage of the present invention is to provide an organic electroluminescent device that can improve lifetime, light efficiency and brightness.

Additional features and advantages of the present invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an electroluminescent device includes: first to third pixel regions; a first electrode in each of the first to third pixel regions, wherein the first electrode of the third pixel region has a first thickness, the first electrode of the first pixel region has a second thickness less than the first thickness, and the first electrode of the second pixel region has a third thickness less than the second thickness; a second electrode in each of the first to third pixel regions; at least two electroluminescent units in each of the first and third pixel regions and disposed between the first electrode and second electrode, wherein one of the at least two electroluminescent units includes a blue light emitting layer and the other of the at least two electroluminescent units include a red/green light emitting layer; and a charge generation layer disposed between the at least two electroluminescent units.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to illustrated embodiments of the present invention, which are illustrated in the accompanying drawings.

Figure 1:
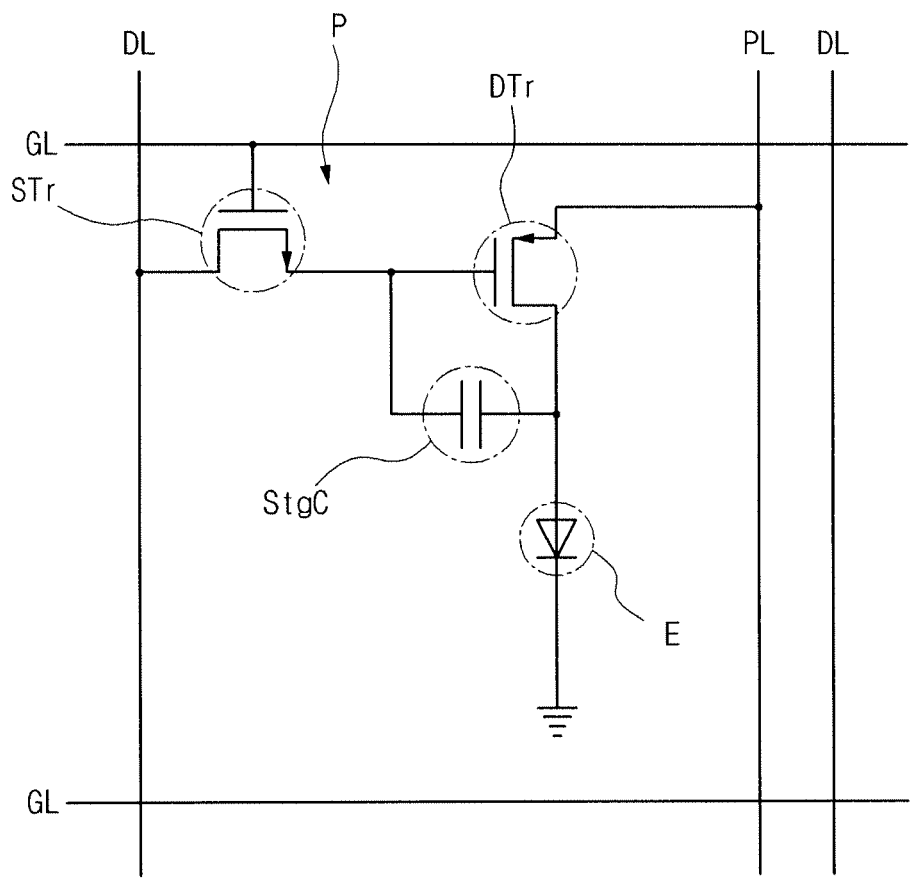
FIG. 1 is a schematic circuit diagram illustrating an active matrix type OELD according to the related art.
Figure 2:
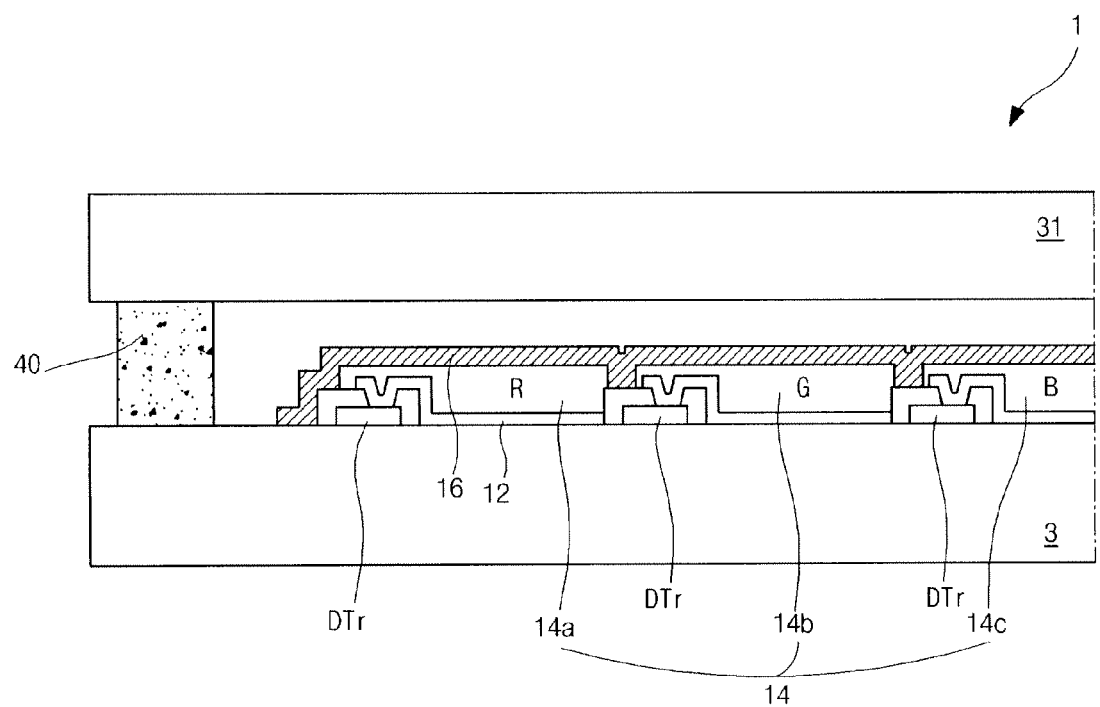
FIG. 2 is a schematic cross-sectional view illustrating an OELD according to the related art.
Figure 3:
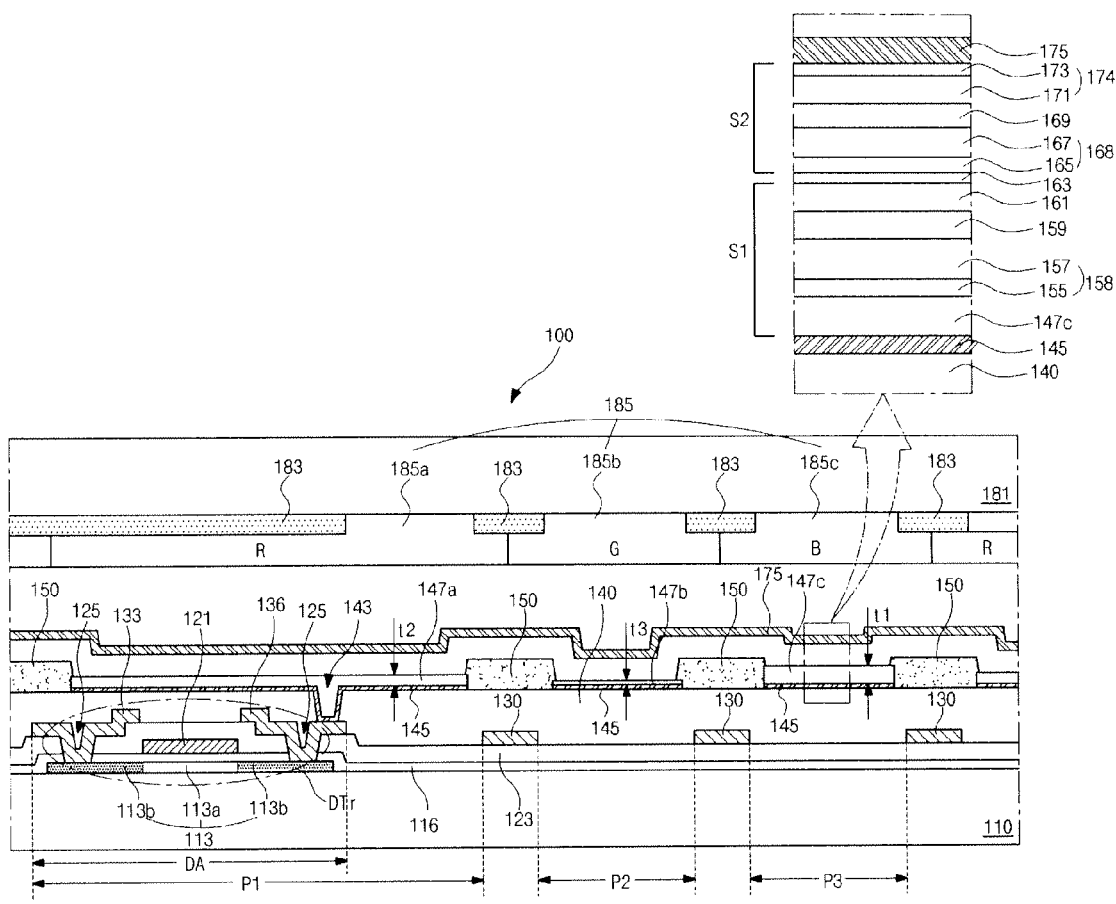
FIG. 3 is a cross-sectional view illustrating three pixel regions of an OELD according to an embodiment of the present invention.

FIG. 3 is a cross-sectional view illustrating three pixel regions of an OELD according to an embodiment of the present invention. For brevity of explanation, a driving thin film transistor DTr is shown in one pixel region P1 among the three pixel regions P1 to P3. Further, a region, where the driving thin film transistor DTr is formed in each pixel region, is referred to as a driving region DTr, and a region, where the switching thin film transistor (not shown) is formed in each pixel region, is referred to as a switching region (not shown).

Referring to FIG. 3, the OELD 100 includes first and second substrates 110 and 181 facing each other. The switching thin film transistor, the driving thin film transistor DTr and an organic light emitting diode are formed in each pixel region on the first substrate 101. A color filter layer 185 that includes red (R), green (G) and blue (B) color filter patterns 185a, 185b and 185c in respective pixel regions P1 to P3 is formed on the second substrate 181.

A semiconductor layer 113 made of polycrystalline silicon is formed in each of the driving region DA and the switching region of each pixel region on the first substrate 110. The semiconductor layer 113 includes a first region 113a that functions as a channel and is made of intrinsic polycrystalline silicon, and a second region 113b that is located at each of both sides of the first region 113a and made of extrinsic polycrystalline silicon. For example, the second region 113b is doped with ions of high concentration.

A gate insulating layer 116 is formed on and covers the semiconductor layer 113. The gate insulating layer 113 may be made of an inorganic insulating material.

A gate electrode 121 is formed in each of the driving region DA and the switching region on the gate insulating layer 113. The gate electrode 121 corresponds to the first region 113a. A gate line (not shown) connected to the gate electrode 121 may be formed at the same process of forming the gate electrode 121.

An insulating interlayer 123 is formed on the gate electrode 121. A semiconductor contact hole 125 exposing each of the both second regions 113b is formed in the insulating interlayer 123 and the gate insulating layer 116.

Source and drain electrodes 133 and 136 are formed on the insulating interlayer 123 and spaced apart from each other. Each of the source and drain electrodes 133 and 136 contacts the corresponding second region 113b through the corresponding semiconductor contact hole 125.

The gate electrode 121, the gate insulating layer 116, the semiconductor layer 113 and the source and drain electrodes 133 and 136 form each of the driving thin film transistor DTr and the switching thin film transistor.

A data line 130 is located on the insulating interlayer 123, crosses the gate line to define the pixel region, and is connected to the source electrode of the switching thin film transistor. The data line 130 may be formed at the same process of forming the source and drain electrodes 133 and 136. Further, a power line spaced apart from and parallel with the data line 130 may be formed on the first substrate 110.

A passivation layer 140 is formed on the source and drain electrodes 133 and 136. The passivation layer 140 may be made of an inorganic insulating material, for example, silicon oxide ($SiO_2$). The passivation layer 140 includes a drain contact hole 143 exposing the drain electrode 136 of the driving thin film transistor DTr.

A reflection pattern 145 is formed on the passivation layer 140 in each pixel region. The reflection pattern 145 contacts the drain electrode 136 of the driving thin film transistor DTr through the drain contact hole 143. The reflection pattern 145 may be made of a metal material having high reflection property, for example, aluminum (Al) or silver (Ag).

A first electrode 147 is formed on the reflection pattern 145. The first electrode 147 functions as an anode and is made of a transparent conductive material having relatively high work function, for example, indium-tin-oxide (ITO), indium-zinc-oxide (IZO) or indium-tin-zinc-oxide (ITZO). The first electrodes 147 of the first to third pixel regions P1 to P3 are different in thickness. This is for maximizing color reproduction and light emission efficiency by realizing micro cavity effect in consideration of reflection and refraction properties of organic light emitting materials emitting red, green and blue. The micro cavity effect is that, by making thicknesses of material layers, that light passes through, different, light emitted from organic light emitting layers repeats selective reflections between a second electrode 175 and the reflection pattern 145 and thus light having desired wavelengths is finally emitted. Accordingly, it is configured that the first electrode 147c of the third pixel region P3 has a first thickness t1 of about 550 Å to about 650 Å to improve color reproduction and light emission efficiency properties of a blue organic light emitting material, the first electrode 147a of the first pixel region P1 has a second thickness t2 of about 420 Å to about 520 Å to improve color reproduction and light emission efficiency properties of a red organic light emitting material, and the first electrode 147b of the second pixel region P2 has a third thickness t3 of about 50 Å to about 150 Å to improve color reproduction and light emission efficiency properties of a green organic light emitting material.

A bank 150 is formed on the first electrode 147 and between the neighboring pixel regions P1 to P3. The bank 150 may be formed to surround each pixel region and overlap peripheral portions of the first electrode 147. Accordingly, the first electrode 147 not covered by the bank 150 is open through an opening of the bank 150.

A first auxiliary layer 158, a blue light emitting layer 159, a second auxiliary layer 161, a charge generation layer (CGL) 163, a third auxiliary layer 168, a red/green light emitting layer 169, and a fourth auxiliary layer 174 are formed sequentially on the first electrode 147. The red/green light emitting layer 169 includes a red phosphorescent material and a green phosphorescent material and thus emits simultaneously red and green. The second electrode 174 is formed on the fourth auxiliary layer 174 and functions as a cathode, which is made of a metal material having a relatively low work function.

The first auxiliary layer 158 includes two layers that are a first hole injection layer 155 and a first hole transport layer 157 located sequentially in a direction from bottom to top.

The third auxiliary layer 168 includes two layers that that are a second hole injection layer 165 and a second hole transport layer 167 located sequentially in a direction from bottom to top. The fourth auxiliary layer 174 includes two layers that are an electron transport layer 171 and a second electron injection layer 173 located sequentially in a direction from bottom to top. The second auxiliary layer 161 may consist of a single layer that is a first electron injection layer 161.

It is preferred that a thickness of the first auxiliary layer 158 is about 550 Å to about 700 Å, a total thickness of the second and third auxiliary layers 161 and 168 is about 1000 Å to about 1100 Å, and a thickness of the fourth auxiliary layer 174 is about 350 Å to about 400 Å.

It is preferred that the thickness ratio of the first hole injection layer 155 to the first hole transport layer 157 is about 1:10. In other words, the first hole transport layer 157 has about ten times the thickness of the first hole injection layer 155.

It is preferred that the thickness ratio of the second hole injection layer 165 to the second hole transport layer 167 is about 1:3.5 to about 1:3.7. In other words, the second hole transport layer 167 has about 3.5 to about 3.7 times the thickness of the second hole injection layer 165.

It is preferred that each of the CGL 163 and the second hole injection layer 173 has a thickness of about 5 Å to 10 Å.

It is preferred that the blue light emitting layer 159 has a thickness of about 150 Å to about 250 Å, and the red/green light emitting layer 169 has a thickness of about 150 Å to about 250 Å.

Accordingly, the blue light emitting layer 159 is located about 550 Å to about 800 Å away from the top surface of the first electrode 147, and the red/green light emitting layer 169 is located about 1800 Å to about 2050 Å away from the top surface of the first electrode 147.

As described above, according to thickness adjustment of the first electrodes 147a to 147c, levels of the blue light emitting layers 159 and the red/green light emitting layers 169 can be adjusted in the respective pixel regions P1 to P3.

Alternatively, the level adjustment of the blue light emitting layers 159 and the red/green light emitting layers 169 according to the pixel regions P1 to P3 may be made by making the first electrodes 147a to 147c have the same thickness and forming buffer patterns (not shown) different in thickness that are formed below the first electrodes 147a to 147c. For example, when the first electrodes 147a to 147c have the same thickness of about 50 Å, the buffer pattern formed in the third pixel region P3 has a thickness of about 500 Å to about 600 Å to maximize blue light emission efficiency, the buffer pattern formed in the first pixel region P1 has a thickness of about 420 Å to about 520 Å to maximize red light emission efficiency, and the buffer pattern formed in the second pixel region P2 has a thickness of about 0 Å to about 100 Å to maximize green light emission efficiency. In this case, the buffer patterns may be formed on the reflection pattern 145. This alternative configuration can have substantially the same technical effect as the above-described configuration. It is preferred that the buffer pattern is made of silicon oxide (SiNx) which has a refractive index of about 2.02.

It is preferred that the blue light emitting layer 159 is made of a fluorescent material of low voltage and high efficiency. It is preferred that the red/green light emitting layer 169 consists of a phosphorescent material emitting red and a phosphorescent material emitting green i.e., has a composition called as one host/two dopants.

As described above, the blue light emitting layer 159 is configured between the first and second auxiliary layers 158 and 161 to substantially form a first organic diode of a first stack S1, and the red/green light emitting layer 169 is configured between the third and fourth auxiliary layers 168 and 174 to substantially form a second organic diode of a second stack S2 that is on the first organic diode with the CGL 163 therebetween. Accordingly, an organic light emitting diode including the two stacks S1 and S2 in a vertical direction is formed, and thus color reproduction and light emission efficiency can be maximized. The organic light emitting diode may include at least the first and second stacks S1 and S2, and the first and second stacks S1 and S2 may be referred to as first and second organic electroluminescent units, respectively.

In other words, in the OELD 100 of the embodiment, the thicknesses of the first electrodes 147a to 147c (or the buffer patterns) and the thicknesses of the first to fourth auxiliary layers 158, 161, 168 and 174 are suitably adjusted such that occurs both constructive and destructive interference between light that reflects off the reflection pattern 145 or light that reflects off the reflection pattern 145 then reflects off the second electrode 175, and light that is emitted from the light emitting layers 159 and 169 toward the first substrate 110. Accordingly, light paths according to properties of the light emitting materials emitting the respective colors are optimized, and thus color reproduction and brightness can be improved.

Lights emitted from the organic layers are different in wavelength because of their properties, and the material layers between the reflection pattern 145 and the second electrode 175 are different in refractive index. Accordingly, when total reflection condition is met, total reflection occurs for incident light at a specific angle. Therefore, produced is light recycling between the reflection pattern 145 and the second electrode 175, and thus brightness can be maximized.

A black matrix 183 is formed between the neighboring pixel regions P1 to P3 on the second substrate 181. The color filter patterns 185a to 185c correspond to the respective pixel regions P1 to P3 and overlap the black matrix 183.

As described above, the red/green light emitting layer 169 and the blue light emitting layer 159 are formed in each pixel region, and thus the organic light emitting diode in each pixel region emits white light. Accordingly, the red, green and blue color filter patterns 185a to 185c are formed in the respective pixel regions P1 to P3 to emit the respective colored lights. Since the light emission efficiency and brightness are maximized in each of the respective pixel regions P1 to P3, color reproduction of lights passing through the red, green and blue color filter patterns 185a to 185c, respectively, can be improved.

FIGS. 4A to 4D are cross-sectional views illustrating a method of manufacturing the OELD according to the embodiment of the present invention.

Figure 4A:
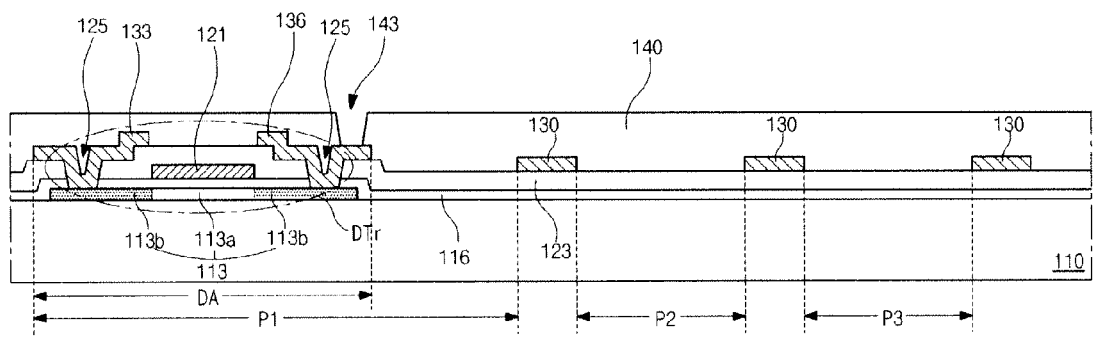
FIGS. 4A to 4D are cross-sectional views illustrating a method of manufacturing the OELD according to the embodiment of the present invention.

Referring to FIG. 4A, an amorphous silicon layer is formed on a first substrate 110. The amorphous silicon layer is crystallized into a polycrystalline silicon layer by irradiating a laser beam on the amorphous silicon or performing a thermal treatment for the amorphous silicon. The silicon may be intrinsic silicon.

Then, performed is a mask process including a photoresist deposition step, a light exposure step using a photo mask, a developing step for the light-exposed photoresist, an etching step, and a stripping step. Through the mask process, the polycrystalline silicon layer is patterned to form a semiconductor pattern in a switching region (not shown) and a driving region DA.

Then, a gate insulating layer 116 is formed on the substrate 110 having the semiconductor pattern. The gate insulating layer 116 may be made of an inorganic insulating material that includes silicon oxide ($SiO_2$) and silicon nitride (SiNx) but not limited thereto.

A first metal layer is formed on the gate insulating layer 116 and patterned in a mask process to form a gate electrode 121 corresponding to a center portion of the semiconductor pattern. At the same process, a gate line (not shown) connected to the gate electrode 121 is formed along a first direction on the gate insulating layer 116. The first metal may include aluminum (Al), aluminum alloy (e.g., AlNd), copper (Cu) and copper alloy but not limited thereto.

An ion doping process is performed for the semiconductor pattern using the gate electrode 121 as a blocking mask to form a second region 113b doped with ions at each of both side portions of the semiconductor pattern not covered by the gate electrode 121. A first region 113a of the center portion of the semiconductor pattern covered by the gate electrode 121 is not doped with the ions. The semiconductor pattern is referred to as a semiconductor layer 113. The ions used in the doping process may be n+ or p+ ions.

Then, an insulating interlayer 123 is formed on the substrate 110 having the gate electrode 121. The insulating interlayer 123 may be made of an inorganic insulating material that includes silicon oxide ($SiO_2$) and silicon nitride (SiNx) but not limited thereto. The insulating interlayer 123 and the gate insulating layer 116 are patterned in a mask process to form a semiconductor contact hole 125 exposing the second region 113b of the semiconductor layer 113.

Then, a second metal layer is formed on the insulating interlayer 123 and patterned in a mask process to form source and drain electrodes 133 and 136 spaced apart from each other. Each of the source and drain electrodes 133 and 136 contacts the second region 113b through the semiconductor contact hole 125. The second metal may include aluminum (Al), aluminum alloy (e.g., AlNd), copper (Cu), copper alloy, chromium (Cr) and molybdenum (Mo) but not limited thereto. The semiconductor layer 113, the gate insulating layer 116, the gate electrode 121 and the source and drain electrodes 133 and 136 form each of a switching thin film transistor (not shown) and a driving thin film transistor DTr. At the same process of forming the source and drain electrodes 133 and 136, a data line 130 connected to the source electrode of the switching thin film transistor and crossing the gate line to define a pixel region P1, P2 or P3 is formed. Further, a power line spaced part from and parallel with the data line 130 may be formed.

Then, a passivation layer 140 is formed on the substrate 110 having the source and drain electrodes 133 and 136. The passivation layer 140 is patterned to form a drain contact hole 143 exposing the drain electrode 136 of the driving thin film transistor DTr. The passivation layer 140 may be made of an inorganic insulating material that includes silicon oxide ($SiO_2$) and silicon nitride (SiNx) but not limited thereto.

Figure 4B:
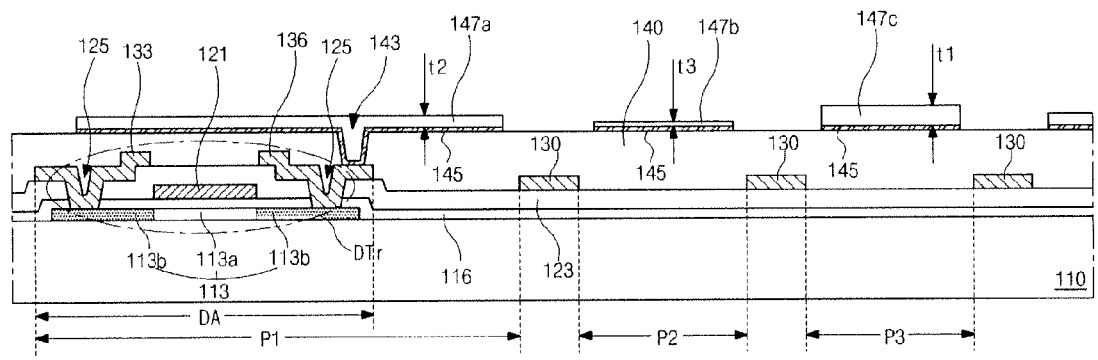

Referring to FIG. 4B, a third metal layer is formed on the passivation layer 140, and then a transparent conductive material layer is formed on the third metal layer. The third metal may be a material having good reflection efficiency, for example, aluminum (Al) or silver (Ag). The transparent conductive material may be a material having a relatively high work function, for example, indium-tin-oxide (ITO), indium-zinc-oxide (IZO) or indium-tin-zinc-oxide (ITZO).

The transparent conductive material may be deposited to have a thickness t3 of a first electrode 147c of the third pixel region P3 that is the thickest one among first pixel electrodes 147a to 147c of the first to third pixel regions P1 to P3. For example, the thickness of the transparent conductive material may be about 550 Å to about 650 Å.

Then, photoresist patterns (not shown) that are different in thickness are formed in the first to third pixel regions P1 to P3, respectively. For example, a first photoresist pattern is formed in the third pixel region P3 and is the thickest one among the photoresist patterns, a second photoresist pattern is formed in the first pixel region P1 and has a thickness less than the first photoresist pattern, and a third photoresist pattern is formed in the second pixel region P2 and has a thickness less that the second photoresist pattern.

Then, the transparent conductive material layer and the third metal layer are patterned using the first to third photoresist patterns to form a reflection pattern 145 and a first electrode pattern in each pixel region. Until this step, the first electrode patterns in the first to third pixel regions P1 to P3 have substantially the same thickness.

Then, a first ashing process is performed to remove the third photoresist pattern that is thinnest. Accordingly, the first electrode pattern in the second pixel region P2 is exposed.

A first etching process is performed for the exposed first electrode pattern of the second region P2 so that the thickness of the exposed first electrode pattern of the second pixel region P2 is firstly reduced.

Then, a second ashing process is performed to remove the second photoresist pattern. Accordingly, the first electrode pattern in the first pixel region P1 is also exposed.

Then, a second etching process is performed for the exposed first electrode patterns of the first and second pixel regions P1 and P2. Through the second etching process, the thickness of the exposed first electrode pattern of the second pixel region P2 is secondly reduced, and the thickness of the exposed first electrode pattern of the first pixel region P1 is reduced.

Then, the remaining first photoresist pattern is removed through a stripping process.

Through the above-described processes, the first electrodes 147a to 147c having different thicknesses are formed in the first to third pixel regions P1 to P3, respectively. In the above processes, it is required to suitably adjust the first and second etching processes such that the first electrode 147c of the third pixel region P3 has the thickness t1 of about 550 Å to about 650 Å, the first electrode 147a of the first pixel region P1 has the thickness t2 of about 420 Å to about 520 Å, and the first electrode 147b of the second pixel region P2 has the thickness t3 of about 50 Å to about 150 Å.

Alternatively, another method may be employed to form the first electrodes different in thickness in the respective pixel regions P1 to P3. For example, a first transparent conductive material is deposited to have a thickness of about 50 Å to about 150 Å and a first patterning process is performed, then a second transparent conductive material is deposited and a second patterning process is performed, and then a third transparent conductive material is deposited and a third patterning process is performed. Through these processes, the first electrodes 147a to 147c different in thickness are formed in the respective pixel regions P1 to P3.

Figure 4C:
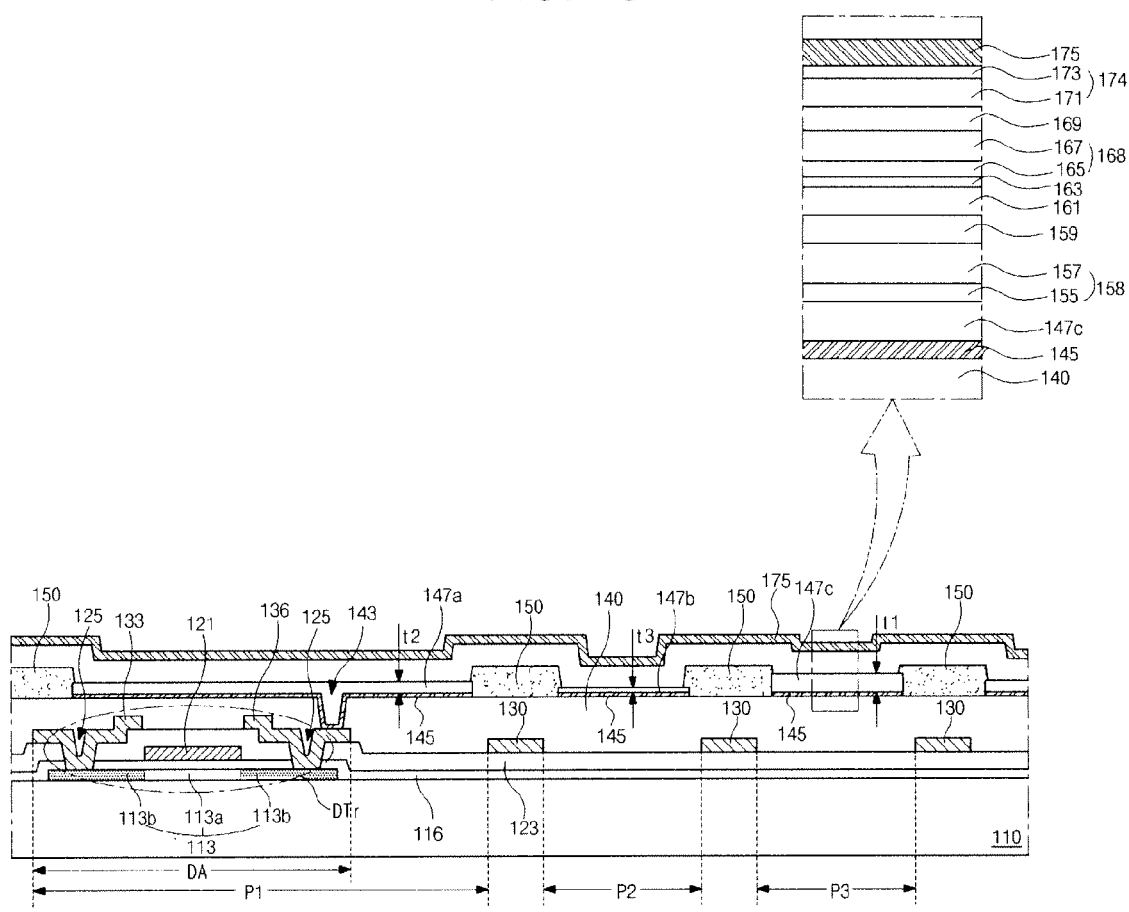

Referring to FIG. 4C, an organic insulating layer is formed on the substrate 110 having the first electrodes 147a to 147c and patterned to form a bank 150 between the neighboring pixel regions P1 to P3 and covering peripheral portions of the first electrodes 147a to 147c. The organic insulating material may include photo acrylic and benzocyclobutene (BCB) but not limited thereto.

Then, processes of sequentially depositing and/or coating materials are performed entirely on a display region of the first substrate 110, or performed on a region surrounded by the bank 150 using a mask. Through these processes, a first hole injection layer 155, a first hole transport layer 157, a blue light emitting layer 159, a first electron injection layer 161, a CGL 163, a second hole injection layer 165, a second hole transport layer 167, a red/green light emitting layer 169, an electron transport layer 171, a second electron injection layer 173 and a second electrode 175 are sequentially formed. Thicknesses of these layers are described in the above explanations relating to FIG. 3. According to the thicknesses of the layers, in each of the first to third pixel regions P1 to P3, a distance from the surface of the first electrode 147a, 147b or 147c to the blue light emitting layer 159 is about 550 Å to about 800 Å, and a distance from the surface of the first electrode 147a, 147b or 147c to the red/green light emitting layer 169 is about 1800 Å to about 2050 Å.

Through the above-described processes, the first substrate 110 can be manufactured.

Figure 4D:
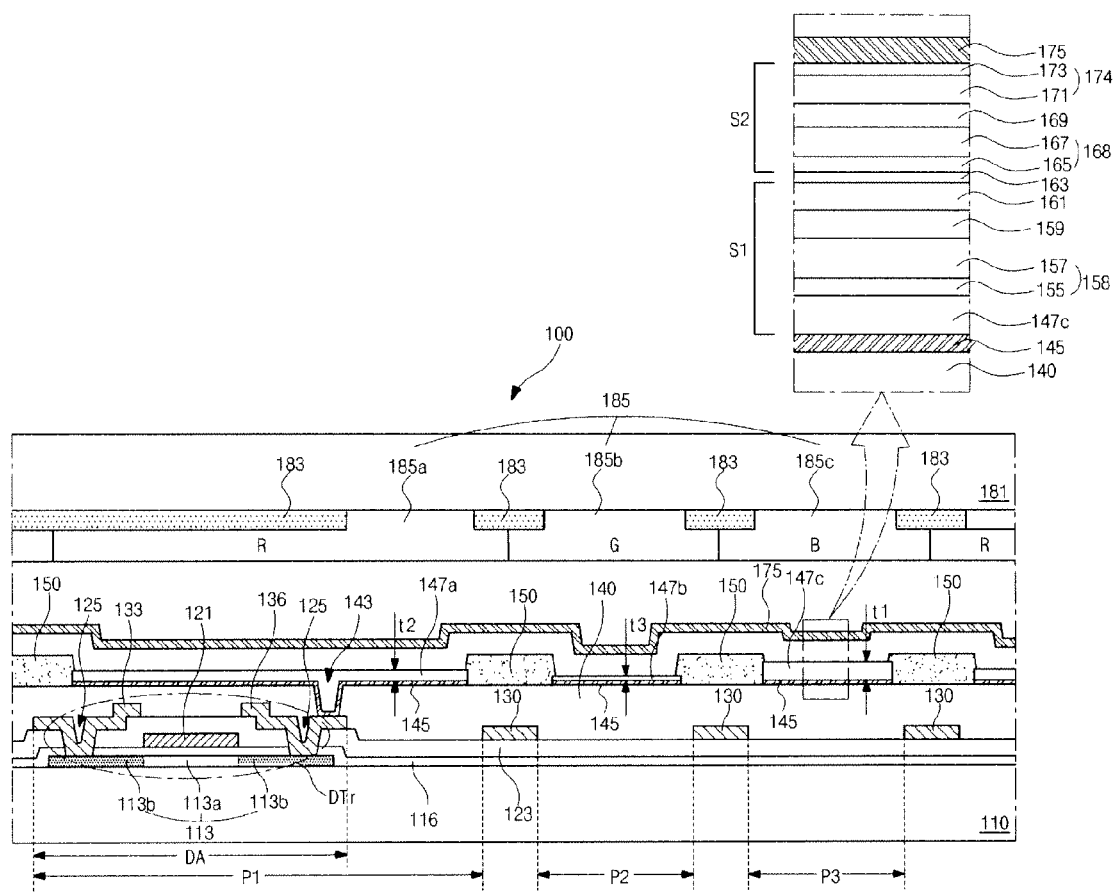

Referring to FIG. 4D, chromium (Cr) or chromium oxide (CrOx) is deposited on a second substrate 181 and patterned to form a black matrix 183. The black matrix 183 may correspond to at least one of the gate line and the data line 130. Then, red (R), green (G) and blue (B) color filter patterns 185a to 185c are formed in the respective pixel regions P1 to P3. Through these processes, the second substrate 181 can be manufactured.

The first and second substrates 110 and 181 are attached to each other using a seal pattern or a fit pattern formed at a non-display region outside the display region. The attaching process may be performed under inert gas condition or vacuum condition. Accordingly, the OELD 100 can be manufactured.

As described above, in the OELD of the embodiment, the organic light emitting diode of each pixel region includes the material layers emitting red, green and blue in the two-stack structure. Accordingly, a lifetime of the OELD can be prevented from depending on a lifetime of the organic light emitting material emitting a specific color, and thus the lifetime of the OELD can be improved.

Further, the light paths according to properties of the light emitting materials emitting the respective colors are optimized. Accordingly, color reproduction, brightness and light emission efficiency can be improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
    first, second and third pixel regions configured to emit red, green and blue, respectively;
    a first electrode in each of the first to third pixel regions, wherein the first electrode of the third pixel region has a first thickness, the first electrode of the first pixel region has a second thickness less than the first thickness, and the first electrode of the second pixel region has a third thickness less than the second thickness;
    a second electrode in each of the first to third pixel regions;
    at least two electroluminescent units in each of the first and third pixel regions and disposed between the first electrode and second electrode, wherein one of the at least two electroluminescent units includes a blue light emitting layer and the other of the at least two electroluminescent units include a red/green light emitting layer; and
    a charge generation layer disposed between the at least two electroluminescent units.

2. The device according to claim 1, wherein the first thickness is about 550 Å to about 650 Å, the second thickness is about 420 Å to about 650 Å, and the third thickness is about 50 Å to about 150 Å.

3. The device according to claim 2, wherein the blue light emitting layer is about 550 Å to about 800 Å away from a surface of the first electrode, and the red/green light emitting layer is about 1800 Å to about 2050 Å away from the surface of the first electrode.

4. The device according to claim 1, wherein each of the at least two electroluminescent units include an hole transport layer, and an electron transport layer.

5. The device according to claim 1, further comprising:
    a first substrate and a second substrate over the first substrate; and
    red, green and blue color filter patterns on the second substrate and corresponding to the first to third pixel regions, respectively.

6. The device according to claim 1, further comprising a bank overlapping the first electrode and between neighboring pixel regions.

7. The device according to claim 1, wherein the blue light emitting layer includes a fluorescent material emitting blue, and the red/green light emitting layer includes phosphorescent materials emitting red and green, respectively.

8. The device according to claim 7, further comprising:
    a passivation layer on the first substrate; and
    a reflection pattern on the passivation layer in each of the first to third pixel regions.

* * * * *